(12) United States Patent
Feng

(10) Patent No.: US 11,398,821 B2
(45) Date of Patent: *Jul. 26, 2022

(54) POWER DEVICE AND ELECTRICAL APPLIANCE

(71) Applicants: GD MIDEA AIR-CONDITIONING EQUIPMENT CO., LTD., Guangdong (CN); MIDEA GROUP CO., LTD., Guangdong (CN)

(72) Inventor: Yuxiang Feng, Guangdong (CN)

(73) Assignees: GD MIDEA AIR-CONDITIONING EQUIPMENT CO., LTD., Foshan (CN); MIDEA GROUP CO., LTD., Foshan (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/475,836

(22) Filed: Sep. 15, 2021

(65) Prior Publication Data

US 2022/0006455 A1 Jan. 6, 2022

Related U.S. Application Data

(63) Continuation of application No. PCT/CN2019/111067, filed on Oct. 14, 2019.

(30) Foreign Application Priority Data

Mar. 19, 2019 (CN) .......................... 201910208191.3

(51) Int. Cl.
*H03K 17/687* (2006.01)
*H02M 1/088* (2006.01)
(Continued)

(52) U.S. Cl.
CPC ........ *H03K 17/6871* (2013.01); *H02M 1/088* (2013.01); *H02M 7/53871* (2013.01); *H03K 17/693* (2013.01)

(58) Field of Classification Search
CPC . H03K 17/6871; H03K 17/693; H02M 1/088; H02M 7/53871
See application file for complete search history.

(56) References Cited

U.S. PATENT DOCUMENTS 9,490,798 B1 11/2016 Charpentier et al.
2018/0294709 A1* 10/2018 Araki ..................... H03K 17/16
(Continued)

FOREIGN PATENT DOCUMENTS

CN 105450027 A 3/2016
CN 206461515 U 9/2017
(Continued)

OTHER PUBLICATIONS

International Search Report dated Jan. 16, 2020 issued in PCT/CN2019/111067.
(Continued)

*Primary Examiner* — Metasebia T Retebo
(74) *Attorney, Agent, or Firm* — Scully Scott Murphy & Presser

(57) ABSTRACT

A power device for an electrical applicant, such as, a household air conditioner, is provided. The power device has a control input terminal, a first driving circuit, and a second driving circuit. When the control input terminal inputs a low level, the first driving circuit and the second driving circuit output high and low level signals in a first voltage range. When the control input terminal inputs a high level, the first driving circuit and the second driving circuit output high and low level signals in a second voltage range. The first voltage range is different from the second voltage range.

21 Claims, 7 Drawing Sheets

(51) Int. Cl.
*H02M 7/5387* (2007.01)
*H03K 17/693* (2006.01)

(56) References Cited

U.S. PATENT DOCUMENTS

2018/0302082 A1* 10/2018 Shinomiya ........... H03K 17/164
2022/0006454 A1* 1/2022 Feng ................. H03K 17/6871

FOREIGN PATENT DOCUMENTS

| | | |
|---|---|---|
| CN | 108281940 A | 7/2018 |
| CN | 208386448 U | 1/2019 |
| CN | 109617383 A | 4/2019 |
| CN | 109639116 A | 4/2019 |
| CN | 109802554 A | 5/2019 |
| CN | 209184504 U | 7/2019 |
| CN | 209448636 U | 9/2019 |
| CN | 209562400 U | 10/2019 |
| JP | 2008061339 A | 3/2008 |

OTHER PUBLICATIONS

Chinese Office Action dated Sep. 18, 2019 issued in CN 201910208191.3.
Chinese Office Action dated Feb. 21, 2020 issued in CN 201910208191.3.
Extended European Search Report dated Apr. 11, 2022 received in European Patent Application No. EP 19919968.8.

* cited by examiner

POWER DEVICE AND ELECTRICAL APPLIANCE

CROSS-REFERENCE TO RELATED APPLICATION

The present application is a continuation application of PCT International Application No. PCT/CN2019/111067, filed on Oct. 14, 2019, which claims priority to and the benefit of the Chinese Patent Application No. "201910208191.3" filed on Mar. 19, 2019, the entire content of which is incorporated herein by reference for all purposes. No new matter has been introduced.

FIELD

The present disclosure relates to the field of the electric appliance technology, in particular relates to a power device and an electric appliance including the power device.

BACKGROUND

An Intelligent Power Module (hereinafter "IPM" for abbreviation) is a power drive product (i.e., a power device) that combines the power electronic technology and the integrated circuit technology. The IPM integrates a power switch device (e.g., a silicon carbide (SiC) device or a silicon (Si) device) with a High Voltage Integrated Circuit (hereinafter "HVIC" for abbreviation), and includes fault detecting circuits for overvoltage, overcurrent, overheating and the like. On one hand, the IPM receives a control signal of a Micro Controller Unit (hereinafter "MCU" for abbreviation) for driving a subsequent circuit to work, and on the other hand the IPM sends a system status detecting signal back to the MCU. Compared to the traditional discrete solution, the IPM has won an increasingly large market due to their advantages of high integration and high reliability, and especially is suitable for a frequency converter and various inverter power supplies of a driving motor, thus being an ideal power electronic device for frequency conversion speed regulation, metallurgical machinery, electric traction, servo drive, and frequency conversion household appliances.

In practical applications, with an increasing demand on system energy consumption, especially in the air conditioning industry, power consumption of the intelligent power module has become a main source of the power consumption for variable frequency electronic control of an inverter air conditioner. Accordingly, how to reduce the power consumption of the intelligent power module has become an important topic affecting the further promotion and application of the intelligent power module and even the inverter air conditioner. Replacing a Si device with a SiC device is an effective way to reduce the power consumption of the intelligent power module, which however also brings a new problem due to different threshold voltages between the SiC device and the Si device where the SiC device is generally of a threshold voltage higher than the Si device. If the SiC device is driven by the same HVIC as the Si device, it will inevitably lead to incomplete conduction of the SiC device, thus it is impossible to take the advantage of the low power consumption by the SiC device, even with an opposite effect reached. On the other hand, if the SiC device is driven by a different HVIC from the Si device, it will cause a difficulty in material organization in the production process with a risk where materials are mixed existing, thus increasing the cost of the intelligent power module accordingly. In addition, if the HVIC driving the SiC device is provided with a higher voltage for power supply, it will inevitably cause an increase of the power consumption of the entire intelligent power module, which will offset the reduced power consumption by the SiC device, thus eliminating the advantage of the reduced power consumption by using the IPM including the SiC device. On the other hand, if the HVIC driving the SiC device is provided with the higher voltage for power supply, a peripheral electronic control scheme must be modified, which will undoubtedly increase resistance to the intelligent power module equipped with the SiC device.

SUMMARY

The present disclosure and certain embodiments thereof provide a power device, including a control input terminal, an upper bridge arm switch tube and a lower bridge arm switch tube, a first driving circuit which is connected to the control input terminal and configured to drive the upper bridge arm switch tube; and a second driving circuit which is connected to the control input terminal and configured to drive the lower bridge arm switch tube, wherein the control input terminal is connectable with a low level or a high level, when the control input terminal is connected with the low level, the first driving circuit and the second driving circuit output a high/low level signal in a first voltage range, and when the control input terminal is connected with the high level, the first driving circuit and the second driving circuit output a high/low level signal in a second voltage range, wherein the first voltage range is different from the second voltage range.

The present disclosure and certain embodiments thereof provide an electric appliance including a power device and a processor connected to the power device. The power device includes a control input terminal, an upper bridge arm switch tube and a lower bridge arm switch tube, a first driving circuit which is connected to the control input terminal and configured to drive the upper bridge arm switch tube; and a second driving circuit which is connected to the control input terminal and configured to drive the lower bridge arm switch tube, wherein the control input terminal is connectable with a low level or a high level, when the control input terminal is connected with the low level, the first driving circuit and the second driving circuit output a high/low level signal in a first voltage range, and when the control input terminal is connected with the high level, the first driving circuit and the second driving circuit output a high/low level signal in a second voltage range, wherein the first voltage range is different from the second voltage range.

According to certain embodiments of the present disclosure, the power device and the electric device can output the high/low level signals in different voltage ranges without changing the external input voltage to meet the requirements of different types of devices, such as the SiC device and the Si device, where respective conduction processes of the different types of the devices all are in full conduction state with individual performances fully achieved. In addition, the first driving circuit and the second driving circuit that are shared for the SiC device and the Si device are used for achieving output of the high/low levels in different voltage ranges, such that the risk where materials are mixed is avoided in the process of producing the power device, thus facilitating material organization and reduction of material costs.

The additional aspects and advantages of the present disclosure will be given below, part of which will become obvious from the following description, or be understood through the practice of the present disclosure.

BRIEF DESCRIPTION OF THE DRAWINGS

The above and/or additional aspects and advantages of the present disclosure will become obvious and understandable with the following description for embodiments by combining the accompanying drawings.

DETAILED DESCRIPTION

Figure 1:
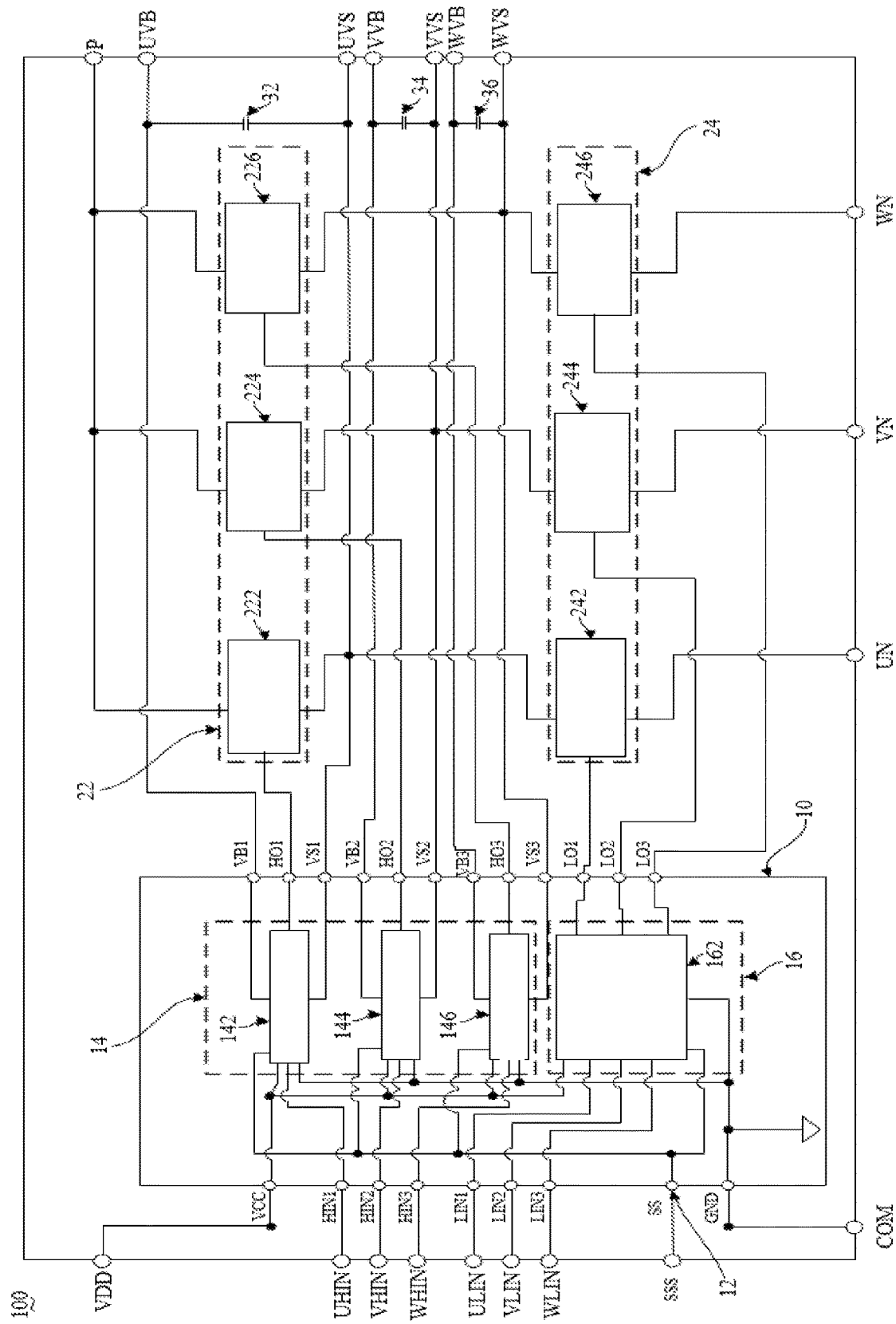
FIG. 1 is a circuit structure diagram showing a power device according to an embodiment of the present disclosure.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In the specification, it should be understood that, the terms indicating orientation or position relationship such as "central", "longitudinal", "lateral", "width", "thickness", "above", "below", "front", "rear", "right", "left", "vertical", "horizontal", "top", "bottom", "inner", "outer", "clockwise", "counter-clockwise" should be construed to refer to the orientation or position relationship as then described or as shown in the drawings. These terms are merely for convenience and concision of description and do not alone indicate or imply that the device or element referred to must have a particular orientation or must be configured or operated in a particular orientation. Thus, it cannot be understood to limit the present disclosure. In addition, terms such as "first" and "second" are used herein for purposes of description and are not intended to indicate or imply relative importance or significance or impliedly indicate quantity of the technical feature referred to. Thus, the feature defined with "first" and "second" may comprise one or more these features. In the description of the present disclosure, "a plurality of" means two or more than two this features, unless specified otherwise.

In description of the present disclosure, it should be noted that unless specified or limited otherwise, the terms "mounted", "connected", "coupled" should be understood broadly, and may be, for example, fixed connections, detachable connections, or integrated connections; may also be mechanical or electrical connections; may also be direct connections or indirect connections via intervening structures; may also be inner communications of two elements or mutual interaction between two elements, which can be understood by those skilled in the art according to specific situations.

With reference to FIG. 1, in an embodiment of the present disclosure, a power device 100 includes a control input terminal 12, an upper bridge arm switch tube 22, a lower bridge arm switch tube 24, a first driving circuit 14, and a second driving circuit 16. The first driving circuit 14 is connected to the control input terminal 12 and configured to drive the upper bridge arm switch tube 22. The second driving circuit 16 is connected to the control input terminal 12 and configured to drive the lower bridge arm switch tube 24. The control input terminal 12 is connectable with a low level or a high level. When the control input terminal 12 is connected with the low level, the first driving circuit 14 and the second driving circuit 16 output a high/low level signal in a first voltage range, and when the control input terminal 12 is connected with the high level, the first driving circuit 14 and the second driving circuit 16 output a high/low level signal in a second voltage range, where the first voltage range is different from the second voltage range.

With reference to FIG. 1, the first driving circuit 14 includes a UH driving circuit 142, a VH driving circuit 144 and a WH driving circuit 146; the second driving circuit 16 includes a UL/VL/WL driving circuit 162; the first driving circuit 14 and the second driving circuit 16 are integrated inside a high voltage integrated circuit (HVIC) tube 10. The VCC terminal of the HVIC tube 10 is configured to serve as a low-voltage area power supply positive terminal VDD of the power device 100, where the VDD is normally 15 V. Inside the HVIC tube 10, the VCC terminal is connected to respective power supply positive terminals of the UH driving circuit 142, the VH driving circuit 144, the WH driving circuit 146 and the UL/VL/WL driving circuit 162.

In this embodiment, the UH driving circuit 142, the VH driving circuit 144, the WH driving circuit 146 and the UL/VL/WL driving circuit 162 each may be a driving circuit inside the electric appliance, for example may be a three-phase driving circuit for a compressor of an air conditioner, where the UH driving circuit 142 is connected to the UL driving circuit, the VH driving circuit 144 is connected to the VL driving circuit, and the WH driving circuit 146 is connected to the WL driving circuit.

The HIN1 terminal of the HVIC tube 10 is configured to serve as a U-phase upper bridge arm input terminal UHIN of the power device 100, and is connected to the input terminal of the UH driving circuit 142 inside the HVIC tube 10. The HIN2 terminal of the HVIC tube 10 is configured to serve as a V-phase upper bridge arm input terminal VHIN of the power device 100, and is connected to the input terminal of the VH driving circuit 144 inside the HVIC tube 10. The HIN3 terminal of the HVIC tube 10 is configured to serve as a W-phase upper bridge arm input terminal WHIN of the power device 100, and is connected to the input terminal of the WH driving circuit 146 inside the HVIC tube 10.

The LIN1 terminal of the HVIC tube 10 is configured to serve as a U-phase lower bridge arm input terminal ULIN of the power device 100, and is connected to the first input terminal of the UL/VL/WL driving circuit 162 inside the HVIC tube 10. The LIN2 terminal of the HVIC tube 10 is configured to serve as a V-phase lower bridge arm input terminal VLIN of the power device 100, and is connected to the second input terminal of the UL/VL/WL driving circuit 162 inside the HVIC tube 10. The LIN3 terminal of the HVIC tube 10 is configured to serve as a W-phase lower bridge arm input terminal WLIN of the power device 100, and is connected to the third input terminal of the UL/VL/WL driving circuit 162 inside the HVIC tube 10. Here, the six input terminals of the U, V and W-phases of the power device 100 are configured to receive 0V or 5V input signals.

The GND terminal of the HVIC tube 10 is configured to serve as a low-voltage area power supply negative terminal COM of the power device 100, and is connected to respective power supply negative terminals of the UH driving circuit 142, the VH driving circuit 144, the WH driving circuit 146 and the UL/VL/WL driving circuit 162.

The upper bridge arm switch tube 22 includes a first upper bridge arm switch tube 222, a second upper bridge arm switch tube 224, and a third upper bridge arm switch tube 226. The lower bridge arm switch tube 24 includes a first lower bridge arm switch tube 242, a second lower bridge arm switch tube 244, and a third lower bridge arm switch tube 246.

The VB1 terminal of the HVIC tube 10 is connected to a high-voltage area power supply positive terminal of the UH driving circuit 142 inside the HVIC tube 10, is connected to one end of the first capacitor 32 outside of the HVIC tube 10, and is configured to serve as a U-phase high-voltage area power supply positive terminal UVB of the power device 100. The HO1 terminal of the HVIC tube 10 is connected to the output terminal of the UH driving circuit 142 inside the HVIC tube 10, and is connected to the control electrode of the U-phase first upper bridge arm switch tube 222 outside the HVIC tube 10. The VS1 terminal of the HVIC tube 10 is connected to a high-voltage area power supply negative terminal of the UH driving circuit 142 inside the HVIC tube 10, is connected to the output negative electrode of the U-phase first upper bridge arm switch tube 222, the output positive electrode of the U-phase first lower bridge arm switch tube 242 and the other end of the first capacitor 32 outside of the HVIC tube 10, and is configured to serve as a U-phase high-voltage area power supply negative terminal UVS of the power device 100.

The VB2 terminal of the HVIC tube 10 is connected to a high-voltage area power supply positive terminal of the VH driving circuit 144 inside the HVIC tube 10, is connected to one end of the second capacitor 34 outside of the HVIC tube 10, and is configured to serve as a V-phase high-voltage area power supply positive terminal VVB of the power device 100. The HO2 terminal of the HVIC tube 10 is connected to the output terminal of the VH driving circuit 144 inside the HVIC tube 10, and is connected to the control electrode of the V-phase second upper bridge arm switch tube 224 outside the HVIC tube 10. The VS2 terminal of the HVIC tube 10 is connected to a high-voltage area power supply negative terminal of the VH driving circuit 144 inside the HVIC tube 10, is connected to an output negative electrode of the second upper bridge arm switch tube 224, an output positive electrode of the V-phase second lower bridge arm switch tube 244 and the other end of the second capacitor 34 outside of the HVIC tube 10, and is configured to serve as a V-phase high-voltage area power supply negative terminal VVS of the power device 100.

The VB3 terminal of the HVIC tube 10 is connected to a high-voltage area power supply positive terminal of the WH driving circuit 146 inside the HVIC tube 10, is connected to one end of the third capacitor 36 outside of the HVIC tube 10, and is configured to serve as a W-phase high-voltage area power supply positive terminal WVB of the power device 100. The HO3 terminal of the HVIC tube 10 is connected to the output terminal of the WH driving circuit 146 inside the HVIC tube 10, and is connected to the control electrode of the W-phase third upper bridge arm switch tube 226 outside the HVIC tube 10. The VS3 terminal of the HVIC tube 10 is connected to a high-voltage area power supply negative terminal of the WH driving circuit 146 inside the HVIC tube 10, is connected to an output negative electrode of the switch tube 226, an output positive electrode of the W-phase third lower bridge arm switch tube 246 and the other end of the third capacitor 36 outside of the HVIC tube 10, and is configured to serve as a W-phase high-voltage area power supply negative terminal WVS of the power device 100.

The LO1 terminal of the HVIC tube 10 is connected to the control electrode of the U-phase first lower bridge arm switch tube 242; the LO2 terminal of the HVIC tube 10 is connected to the control electrode of the V-phase second lower bridge arm switch tube 244; and the LO3 terminal of the HVIC tube 10 is connected to the control electrode of the W-phase third lower bridge arm switch tube 246. An output negative electrode of the U-phase first lower bridge arm switch tube 242 is configured to serve as a U-phase low-voltage reference terminal UN of the power device 100. An output negative electrode of the V-phase second lower bridge arm switch tube 244 is configured to serve as a V-phase low-voltage reference terminal VN of the power device 100. An output negative electrode of the W-phase third lower bridge arm switch tube 246 is configured to serve as a W-phase low-voltage reference terminal WN of the power device 100.

An output positive electrode of the U-phase first upper bridge arm switch tube 222, an output positive electrode of the V-phase second upper bridge arm switch tube 224, and an output positive electrode of the W-phase third upper bridge arm switch tube 226 are connected and configured to serve as a high-voltage input terminal P of the power device 100, where P is normally 300 V. In an example, the voltage of the power supply of VDD is 20 V.

The function of the HVIC tube 10 includes the following.

1. When the control input terminal 12 is connected with a low level, HO1 to HO3 and LO1 to LO3 output high/low level signals at 0 V to 20 V. In other words, when the control input terminal 12 is connected with the low level, the UH driving circuit 142, the VH driving circuit 144, the WH driving circuit 146 and the UL/VL/WL driving circuit 162 output the high/low level signals in a first voltage range. In an example, the first voltage range may be 0 V to 20 V.

2. When the control input terminal 12 is connected with a high level, HO1 to HO3 and LO1 to LO3 output high/low level signals at 0 V to 15 V. In other words, when the control input terminal 12 is connected with the high level, the UH driving circuit 142, the VH driving circuit 144, the WH driving circuit 146 and the UL/VL/WL driving circuit 162 output the high/low level signals in a second voltage range. In an example, the second voltage range may be 0 V to 15 V.

Figure 2:
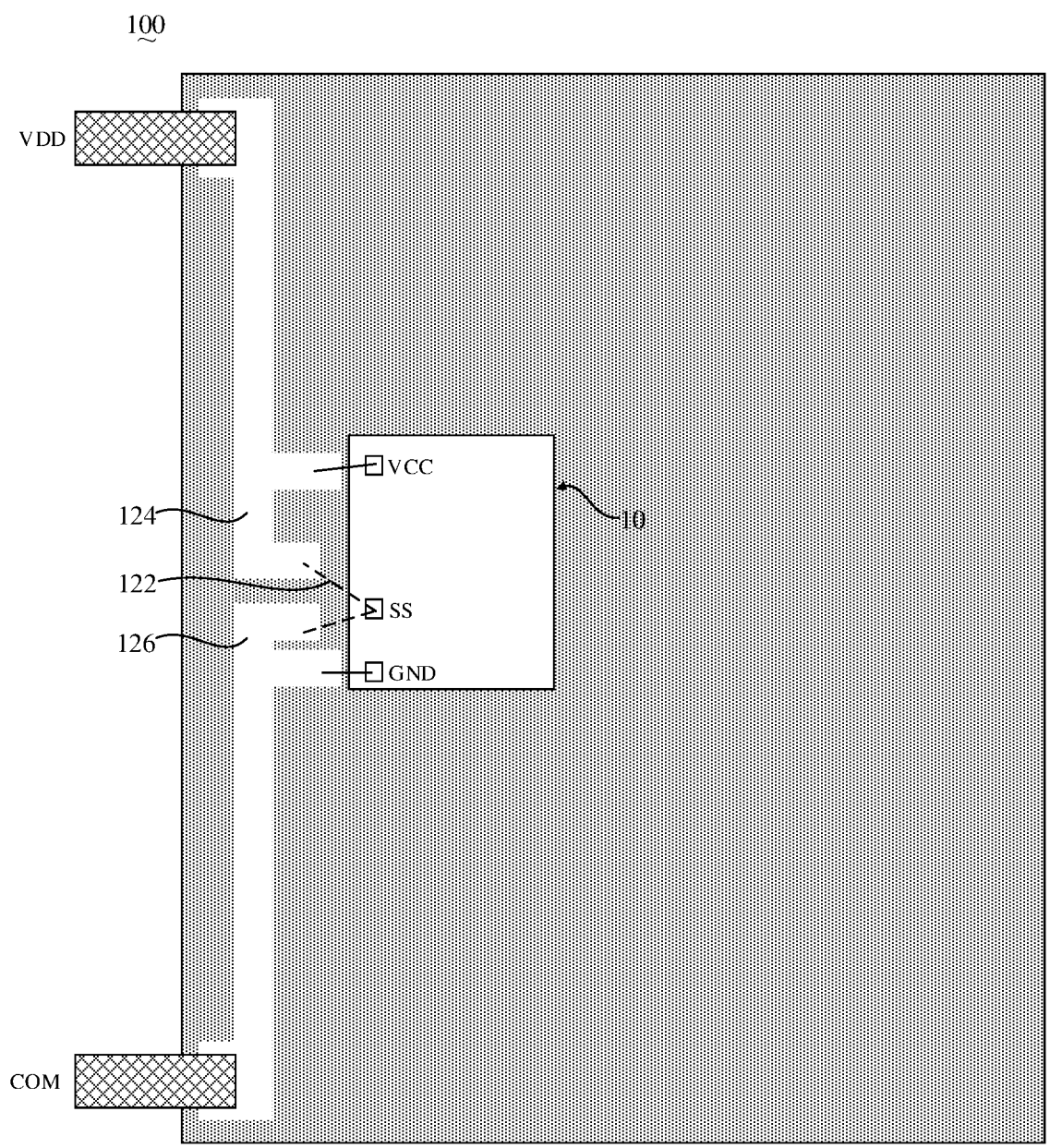
FIG. 2 is a schematic diagram showing a power device in which a control input terminal is connected to a power supply or ground through a bonding wire according to an embodiment of the present disclosure.
Figure 3:
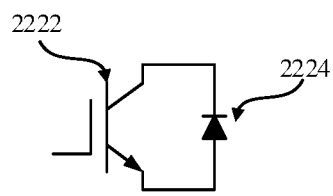
FIGS. 3-7 each are a schematic diagram showing a switch tube according to certain embodiments of the present disclosure.
Figure 4:
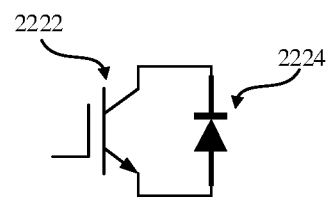

In some embodiments, with reference to FIG. 2, when the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each include an IGBT tube (the Si device is the Si IGBT tube 2222 as shown in FIGS. 3-4). For example, when the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are the Si device, or when the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are a combination of the Si device and the SiC device, inside the power device 100, the control input terminal 12 is connected to the VCC terminal through a bonding wire 122, and the first driving circuit 14 and the second driving circuit 16 output the high/low level signal in the first voltage range.

Figure 5:
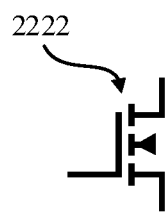
Figure 6:
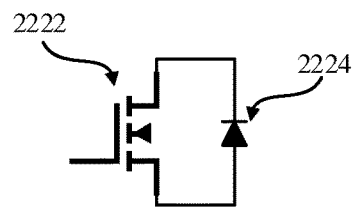
Figure 7:
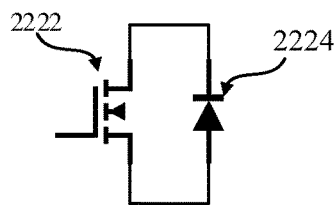

When the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each include a SiC MOS tube (the SiC device is the SiC MOS tube 2222 as shown in FIGS. 5-7). For example, when the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are the SiC device, or when the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are a combination of the SiC device and the Si device, inside the power device 100, the control input terminal 12 is connected to the GND terminal through a bonding wire 122, and the first driving circuit 14 and the second driving circuit 16 output the high/low level signal in the second voltage range.

With reference to FIG. 2, in an embodiment, the power device 100 includes a first connecting portion 124, a second connecting portion 126 and an SSS terminal. The first connecting portion 124 is configured to connect the VCC terminal and the VDD terminal, and the second connecting portion 126 is configured to connect the GND terminal and the COM terminal. The SSS terminal is connected to the control input terminal 12, and the SSS terminal is connected to the GND terminal through the bonding wire 122. The first connecting portion 124 and the second connecting portion 126 may be a guideline, an electrode and the like.

In addition, in some embodiments, the HVIC tube 10 is provided inside a switch. The switch is connected to the GND terminal, the VCC terminal and the control input terminal 12, respectively, and configured to control conduction between the control input terminal 12 and the VCC terminal or the GND terminal. For example, when the control input terminal 12 needs to be connected with the low level, the control input terminal 12 is connected to the GND terminal; and when the control input terminal 12 needs to be connected with the high level, the control input terminal 12 is connected to the VCC terminal.

In some embodiments, with reference to FIG. 1, the power device 100 includes a controller (not shown). The control input terminal 12 is connected to the controller through a bonding wire 122. The controller is configured to output a high level or a low level. The controller may include a digital circuit configured to output a high/low level, or may also include a trigger and the like, but not limited thereto. For example, the controller is configured to output a high level same as the VCC terminal, or output a low level same as the GND terminal, or output other high level or low level according to actual needs. In addition, the controller may be installed inside the HVIC tube 10, for example installed between the control input terminal 12 and the SSS input terminal or elsewhere. Alternatively, the controller may also be installed outside the HVIC tube 10, for example installed at a position where is close to the control input terminal 12 or elsewhere. Alternative, the controller is installed on a microprocessor.

In an embodiment of the present disclosure, the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each may be a combination of an Insulated Gate Bipolar Transistor (hereinafter "IGBT" for abbreviation) tube (i.e., the Si device) and a Fast Recovery Diode (hereinafter "FRD" for abbreviation) tube connected in parallel, or may be a combination of the IGBT tube and a SiC Schottky Barrier Diode (hereinafter "SBD" for abbreviation) tube, or may be a SiC Metal Oxide Semiconductor (hereinafter "MOS" for abbreviation) tube (i.e., the SiC device), or may be a combination of the SiC MOS tube and the FRD tube, or may be a combination of the SiC MOS tube and the SiC SBD tube, which may be selected particularly according to actual needs, and thus will not be limited in particular hereby.

According to an embodiment of the present disclosure, when the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are the SiC device, the control input terminal 12 is connected with a low level signal; and when the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are the Si device, the control input terminal 12 is connected with a high level signal.

According to certain embodiments of the present disclosure, the power device 100 can output the high/low level signals in different voltage ranges without changing the external input voltage to meet the requirements of different types of devices, such as the SiC device and the Si device, where respective conduction processes of the different types of the devices all are in full conduction state with individual performances achieved. In addition, the first driving circuit 14 and the second driving circuit 16 that are shared for the SiC device and the Si device are used for achieving output of the high/low levels in different voltage ranges, such that the risk where materials are mixed is avoided in the process of producing the power device 100, thus facilitating material organization and reduction of material costs. Accordingly, the voltage of the power supply for the power device 100 remains unchanged at 20 V, the peripheral circuit does not need to be modified, and the power consumption of the HVIC tube 10 has not substantially increased. The same HVIC tube 10 is configured to drive both the SiC device and the Si device, such that the risk where materials are mixed is avoided in the production process, thus facilitating material organization and reduction of material costs. The voltage used to drive the SiC device is 20 V and the voltage used to drive the Si device is 15 V, such that the respective conduction processes of the SiC device and the Si device both are in the full conduction state with individual performances achieved. The technical solution fully integrating the SiC power device with the traditional Si power device plays an important role in upgrading of the power device, promoting of the power device, and energy-saving of the inverter household appliance, especially the inverter air conditioner.

The present disclosure will be further described below in conjunction with certain embodiments.

FIGS. 3-7 are different combinations of the switch tubes. As the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 have exactly the same structure, the U-phase first upper bridge arm switch tube 222 is taken as an example for illustration.

FIG. 3 shows a combination of Si IGBT and Si FRD. The collector of the Si IGBT tube 2222 is connected to a cathode of the Si FRD tube 2224, and is configured to serve as the output positive electrode of the U-phase first upper bridge arm switch tube 222. The emitter of the Si IGBT tube 2222 is connected to the anode of the Si FRD tube 2224, and is configured to serve as the output negative electrode of the U-phase first upper bridge arm switch tube 222. The gate of the Si IGBT tube 2222 is configured to serve as the control electrode of the U-phase first upper bridge arm switch tube 222.

FIG. 4 shows a combination of Si IGBT and SiC SBD. The collector of the Si IGBT tube 2222 is connected to a cathode of the SiC SBD tube 2224, and is configured to serve as the output positive electrode of the U-phase first upper bridge arm switch tube 222. The emitter of the Si IGBT tube 2222 is connected to the anode of the SiC SBD tube 2224, and is configured to serve as the output negative electrode of the U-phase first upper bridge arm switch tube 222. The gate of the Si IGBT tube 2222 is configured to serve as the control electrode of the U-phase first upper bridge arm switch tube 222.

FIG. 5 shows SiC MOS. The drain of the SiC MOS tube 2222 is configured to serve as the output positive electrode of the U-phase first upper bridge arm switch tube 222. The source of the SiC MOS tube 2222 is configured to serve as the output negative electrode of the U-phase first upper bridge arm switch tube 222. The gate of the SiC MOS tube 2222 is configured to serve as the control electrode of the U-phase first upper bridge arm switch tube 222.

FIG. 6 shows a combination of SiC MOS and Si FRD. The drain of the SiC MOS tube 2222 is connected to the cathode of the Si FRD tube 2224, and is configured to serve as the output positive electrode of the U-phase first upper bridge arm switch tube 222. The source of the SiC MOS tube 2222 is connected to the anode of the Si FRD tube 2224, and is configured to serve as the output negative electrode of the U-phase first upper bridge arm switch tube 222. The gate of the SiC MOS tube 2222 is configured to serve as the control electrode of the U-phase first upper bridge arm switch tube 222.

FIG. 7 shows a combination of SiC MOS and SiC SBD. The drain of the SiC MOS tube 2222 is connected to the cathode of the SiC SBD tube 2224, and is configured to serve as the output positive electrode of the U-phase first upper bridge arm switch tube 222. The source of the SiC MOS tube 2222 is connected to the anode of the SiC SBD tube 2224, and is configured to serve as the output negative electrode of the U-phase first upper bridge arm switch tube 222. The gate of the Si IGBT tube 2222 is configured to serve as the control electrode of the U-phase first upper bridge arm switch tube 222.

It would be understood that the second upper bridge arm switch tube 224 may be any combination of the switch tubes as shown in FIGS. 3-7; the third upper bridge arm switch tube 226 may be any combination of the switch tubes as shown in FIGS. 3-7; the first lower bridge arm switch tube 242 may be any combination of the switch tubes as shown in FIGS. 3-7; the second lower bridge arm switch tube 244 may be any combination of the switch tubes as shown in FIGS. 3-7; and the third lower bridge arm switch tube 246 may be any combination of the switch tubes as shown in FIGS. 3-7.

In addition, the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 having the exactly same structure refers to that, in the actual power device 100, the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are the switch tube of the combination of Si IGBT and Si FRD as shown in FIG. 3; or the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are the switch tube of the combination of Si IGBT and SiC SBD as shown in FIG. 4; or the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are the switch tube of SiC MOS as shown in FIG. 5; or the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are the switch tube of the combination of SiC MOS and Si FRD as shown in FIG. 6; or the first upper bridge arm switch tube 222, the second upper bridge arm switch tube 224, the third upper bridge arm switch tube 226, the first lower bridge arm switch tube 242, the second lower bridge arm switch tube 244 and the third lower bridge arm switch tube 246 each are the switch tube of the combination of SiC MOS and SiC SBD as shown in FIG. 7.

Figure 8:
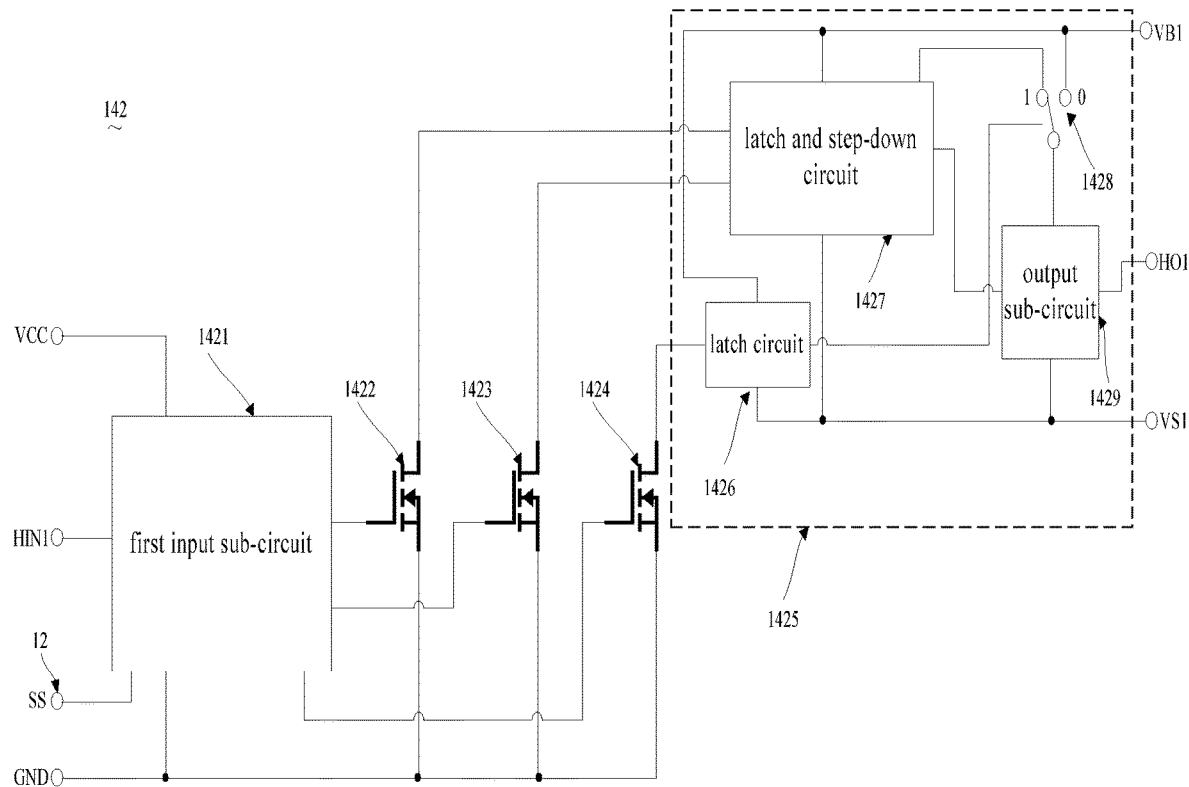
FIG. 8 is a schematic diagram showing a UH (U-phase High-side) driving circuit according to an embodiment of the present disclosure.
Figure 9:
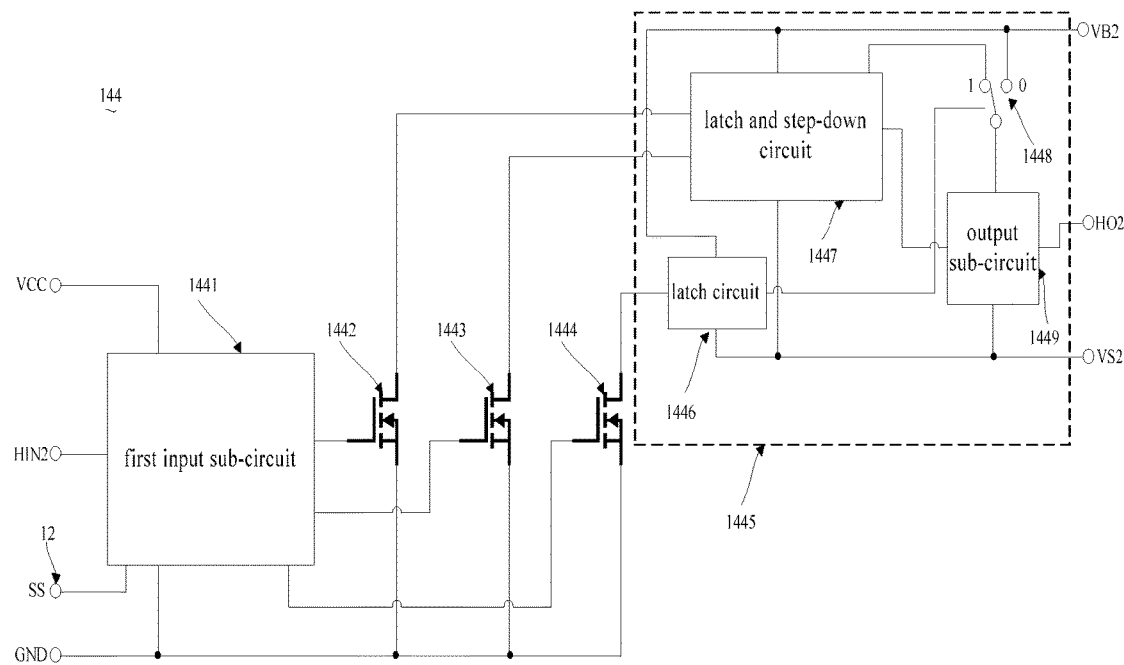
FIG. 9 is a schematic diagram showing a VH (V-phase High-side) driving circuit according to an embodiment of the present disclosure.
Figure 10:
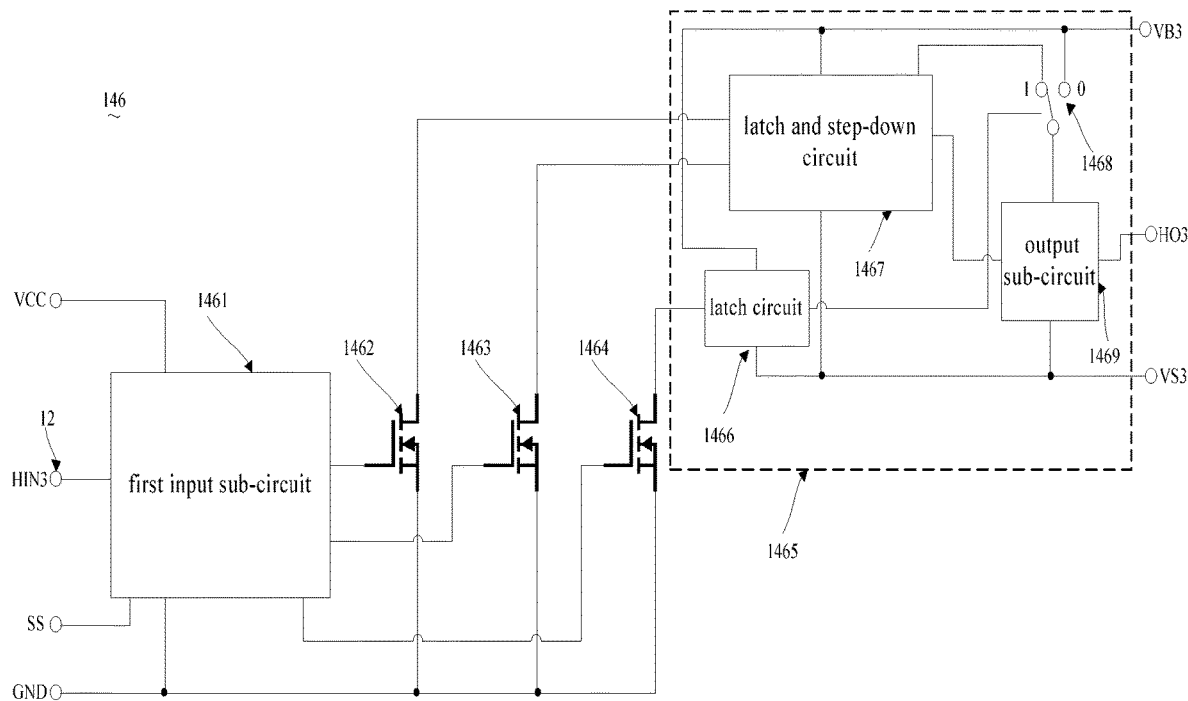
FIG. 10 is a schematic diagram showing a WH (W-phase High-side) driving circuit according to an embodiment of the present disclosure.
Figure 11:
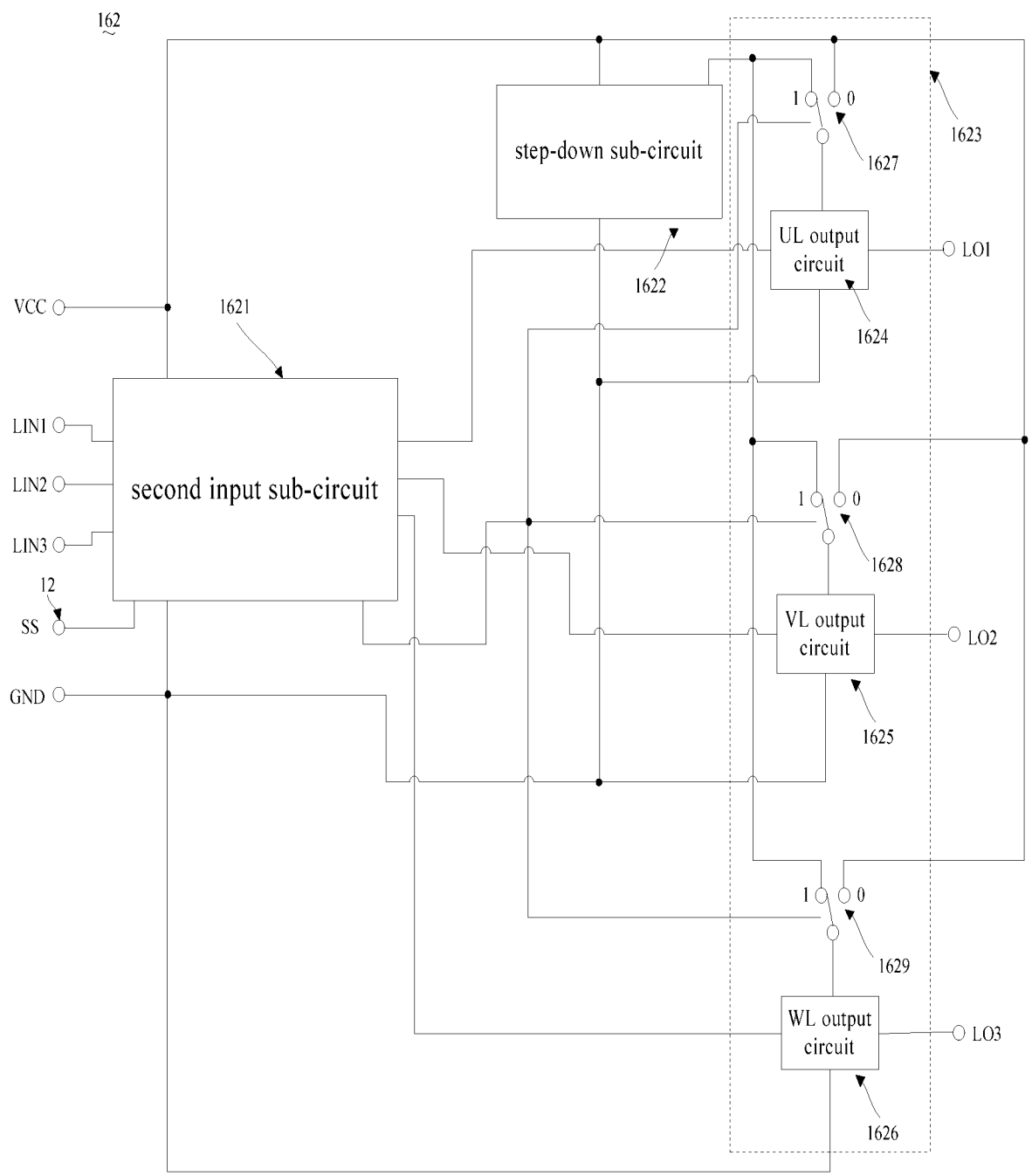
FIG. 11 is a schematic diagram showing a UL/VL/WL (U-phase Low-side/V-phase Low-side/W-phase Low-side) driving circuit according to an embodiment of the present disclosure.

FIGS. 8-10 show respective embodiments of the UH driving circuit 142, the VH driving circuit 144, and the WH driving circuit 146, and FIG. 11 shows the structure of the UL/VL/WL driving circuit 162.

With reference to FIGS. 1 and 8, the UH driving circuit 142 includes: a first input sub-circuit 1421, a first switch tube 1422, a second switch tube 1423, a third switch tube 1424, and a first voltage output sub-circuit 1425. The first input sub-circuit 1421 is connected to the control input terminal 12. The first input sub-circuit 1421 has a first output terminal, a second output terminal and a third output terminal. When the control input terminal 12 is connected with the low level, the first output terminal and the second output terminal output trigger pulses; and when the control input terminal 12 is connected with the high level, the first output terminal, the second output terminal and the third output terminal output trigger pulses.

The first switch tube 1422 is connected to the first output terminal, when the first output terminal outputs a trigger pulse, the first switch tube 1422 is turned on. The second switch tube 1423 is connected to the second output terminal, when the second output terminal outputs a trigger pulse, the second switch tube 1423 is turned on. The third switch tube 1424 is connected to the third output terminal, when the third output terminal outputs a trigger pulse, the third switch tube 1424 is turned on.

The first voltage output sub-circuit 1425 is connected to the first switch tube 1422, the second switch tube 1423 and the third switch tube 1424, respectively. When the control input terminal 12 is connected with the low level, the high level signal is not present at the third output terminal of the first input sub-circuit 1421, i.e., no trigger pulse is present, and the third switch tube 1424 is not turned on, at which time the first voltage output sub-circuit 1425 outputs the high/low level signal in the first voltage range. When the control input terminal 12 is connected with the high level, the high level pulse signal is present at the third output terminal of the first input sub-circuit 1421, i.e., the trigger pulse is present, and the third switch tube 1424 is turned on for outputting the high/low level signal in the second voltage range.

Continue referring to FIG. 8, the first voltage output sub-circuit 1425 includes: a latch circuit 1426, a latch and step-down circuit 1427, and a first switching module 1428.

The latch and step-down circuit 1427 is connected to the first switch tube 1422 and the second switch tube 1423. The first switching module 1428 is connected to the latch and step-down circuit 1427 and the power supply, respectively. The latch circuit 1426 is connected to the third switch tube 1424. The latch circuit 1426 is configured to control the first switching module 1428: when the third switch tube 1424 is not turned on, the latch circuit 1426 is configured to control an action of the first switching module 1428 to take a voltage of the power supply as an output voltage of the output sub-circuit 1429; and when the third switch tube 1424 is turned on, the latch circuit 1426 is configured to control an action of the first switching module 1428 to take an output voltage of the latch and step-down circuit 1427 as an output voltage of the output sub-circuit 1429.

As shown in FIG. 8, inside the UH driving circuit 142, VCC is connected to the positive terminal of the power supply of the first input sub-circuit 1421; HIN1 is connected to the input terminal of the first input sub-circuit 1421; and the control input terminal 12 is connected to the control terminal of the first input sub-circuit 1421. The first output terminal of the first input sub-circuit 1421 is connected to the gate of the first switch tube (such as a high-voltage DMOS tube) 1422; the second output terminal of the first input sub-circuit 1421 is connected to the gate of the second switch tube (such as a high-voltage DMOS tube) 1423; and the third output terminal of the first input sub-circuit 1421 is connected to the gate of the third switch tube (such as a high-voltage DMOS tube) 1424. The GND terminal is connected to the negative terminal of the power supply of the first input sub-circuit 1421, the substrate and the source of the first switch tube 1422, the substrate and the source of the second switch tube 1423, and the substrate and the source of the third switch tube 1424.

The drain of the first switch tube 1422 is connected to the first input terminal of the latch and step-down circuit 1427, and the drain of the second switch tube 1423 is connected to the second input terminal of the latch and step-down circuit 1427. The first output terminal of the latch and step-down circuit 1427 is connected to the 1 selection terminal of the first switching module 1428 (e.g., an analog switch), and the second output terminal of the latch and step-down circuit 1427 is connected to the input terminal of the output sub-circuit 1429. The output terminal of the latch circuit 1426 is connected to the control terminal of the first switching module 1428, and the fixed terminal of the first switching module 1428 is connected to the positive terminal of the power supply of the output sub-circuit 1429. The VB1 is connected to the positive terminal of the power supply of the latch circuit 1426, the positive terminal of the power supply of the latch and step-down circuit 1427, and the 0 selection terminal of the first switching module 1428. The VS1 is connected to the negative terminal of the power supply of the latch circuit 1426, the negative terminal of the power supply of the latch and step-down circuit 1427, and the negative terminal of the power supply of the output sub-circuit 1429. The HO1 is connected to the output terminal of the output sub-circuit 1429.

The function of the first input sub-circuit 1421 is described as follows:

at the rising edge of the signal at the input terminal of the first input sub-circuit 1421, the first output terminal of the first input sub-circuit 1421 outputs a pulse signal with a pulse width of about 300 ns; at the falling edge of the signal at the input terminal of the first input sub-circuit 1421, the second output terminal of the first input sub-circuit 1421 outputs a pulse signal with a pulse width of about 300 ns. When the control input terminal 12 of the first input sub-circuit 1421 is connected with a high level, the third output terminal of the first input sub-circuit 1421 outputs a pulse signal with a pulse width of about 300 ns.

The function of the latch circuit 1426 is described as follows:

when a low level signal is present at the input terminal of the latch circuit 1426, the output terminal of the latch circuit 1426 outputs a high level, otherwise the output terminal of the latch circuit 1426 outputs a low level.

The function of the latch and step-down circuit 1427 is described as follows:

when a low level is present at the first input terminal of the latch and step-down circuit 1427, the second output terminal of the latch and step-down circuit 1427 continuously outputs a high level; and when a low level is present at the second input terminal of the latch and step-down circuit 1427, the first output terminal of the latch and step-down circuit 1427 continuously outputs a low level. That is, the signal from the HIN1 is decomposed into two pulse signals at two output terminals of the first input sub-circuit 1421 which are re-integrated into a complete signal. In addition, the latch and step-down circuit 1427 has a step-down circuit inside, and the second output terminal of the latch and step-down circuit 1427 outputs a voltage of 15V for the VS1.

The function of the output sub-circuit 1429 is:

to output a signal having a voltage which is consistent with the positive terminal of the power supply thereof when being connected with a high level or is consistent with the negative terminal of the power supply thereof when being connected with a low level and having a phase position which is consistent with that of the HIN1.

Here, using a 300 ns narrow pulse signal to control the first switch tube 1422, the second switch tube 1423, and the third switch tube 1424 is to shorten the conduction time for the first switch tube 1422, the second switch tube 1423, and the third switch tube 1424, thereby reducing respective power consumption.

Its working principle is described as follows:

after the signal from the HIN1 passes through the first input sub-circuit 1421, the first output terminal and the second output terminal of the first input sub-circuit 1421 output 300 ns narrow pulses at the rising edge and the falling edge of the signal, respectively. The narrow pulses are configured to respectively control the first switch tube 1422 and the second switch tube 1423 to be turned on for 300 ns, so that the first input terminal and the second input terminal of the latch and step-down circuit 1427 generate 300 ns low levels, respectively. The latch and step-down circuit 1427 has an RS trigger and other devices inside, so that two low level signals are recombined into a complete signal having a phase same as the HIN1.

When the control input terminal 12 is connected with a low level, a high level pulse is not present at the third output terminal of the first input sub-circuit 1421, the third switch tube 1424 is not turned on, and the low level is not present at the control input terminal 12 of the latch circuit 1426, then the output terminal of the latch circuit 1426 maintains at a low level. The positive terminal of the power supply of the output sub-circuit 1429 remains connected to the 0 selection terminal of the first switching module 1428, i.e., connected to the VB1, such that the output sub-circuit 1429 outputs the high/low level in the range of 0 V to 20 V to adapt to the SiC device in the switch tube for giving full play to its performance.

When the control input terminal 12 is connected with a high level, a high level pulse is present at the third output terminal of the first input sub-circuit 1421, the third switch tube 1424 is turned on for 300 ns. The 300 ns low level is present at the control input terminal 12 of the latch circuit 1426, then the output terminal of the latch circuit 1426 outputs a high level. The positive terminal of the power supply of the output sub-circuit 1429 is switched to be connected to the 1 selection terminal of the first switching module 1428, i.e., connected to the first output terminal of the latch and step-down circuit 1427, such that the output sub-circuit 1429 outputs the high/low level in the range of 0 V to 15 V to adapt to the Si device in the switch tube for giving full play to its performance.

With reference to FIGS. 1 and 9, the VH driving circuit 144 is same as the UH driving circuit 142; and the VH driving circuit 144 includes: a first input sub-circuit 1441, a first switch tube 1442, a second switch tube 1443, a third switch tube 1444, and a first voltage output sub-circuit 1445. The first input sub-circuit 1441 is connected to the control input terminal 12. The first input sub-circuit 1441 includes a first output terminal, a second output terminal and a third output terminal. When the control input terminal 12 is connected with a low level, the first output terminal and the second output terminal output trigger pulses; and when the control input terminal 12 is connected with a high level, the first output terminal, the second output terminal and the third output terminal output trigger pulses.

The first switch tube 1442 is connected to the first output terminal, when the first output terminal outputs a trigger pulse, the first switch tube 1442 is turned on. The second switch tube 1443 is connected to the second output terminal, when the second output terminal outputs a trigger pulse, the second switch tube 1443 is turned on. The third switch tube 1444 is connected to the third output terminal, when the third output terminal outputs a trigger pulse, the third switch tube 1444 is turned on.

The first voltage output sub-circuit 1445 is connected to the first switch tube 1442, a second switch tube 1443, and a third switch tube 1444, respectively. When the control input terminal 12 is connected with a low level, a high level signal is not present at the third output terminal of the first input sub-circuit 1441, the third switch tube 1444 is not turned on, at which time the first voltage output sub-circuit 1445 outputs the high/low level signal in the first voltage range. When the control input terminal 12 is connected with a high level, a high level pulse is present at the third output terminal of the first input sub-circuit 1441, the third switch tube 1444 is turned on for outputting the high/low level signal in the second voltage range.

Continue referring to FIG. 9, the first voltage output sub-circuit 1445 includes: a latch circuit 1446, a latch and step-down circuit 1447 and a first switching module 1448.

The latch and step-down circuit 1447 is connected to the first switch tube 1442 and the second switch tube 1443. The first switching module 1448 is connected to the latch and step-down circuit 1447 and the power supply, respectively. The latch circuit 1446 is connected to the third switch tube 1444. The latch circuit 1446 is configured to control the first switching module 1448: when the third switch tube 1444 is not turned on, the latch circuit 1446 is configured to control an action of the first switching module 1448 to take a voltage of the power supply as an output voltage of the output sub-circuit 1449; and when the third switch tube 1444 is turned on, the latch circuit 1446 is configured to control an action of the first switching module 1448 to take an output voltage of the latch and step-down circuit 1447 as an output voltage of the output sub-circuit 1449.

As shown in FIG. 9, inside the VH driving circuit 144, the VCC is connected to the positive terminal of the power supply of the first input sub-circuit 1441; the HIN2 is connected to the input terminal of the first input sub-circuit 1441; and the control input terminal 12 is connected to the control terminal of the first input sub-circuit 1441. The first output terminal of the first input sub-circuit 1441 is connected to the gate of the first switch tube (such as a high-voltage DMOS tube) 1442; the second output terminal of the first input sub-circuit 1441 is connected to the gate of the second switch tube (such as a high-voltage DMOS tube) 1443; and the third output terminal of the first input sub-circuit 1441 is connected to the gate of the third switch tube (such as a high-voltage DMOS tube) 1444. The GND terminal is connected to the negative terminal of the power supply of the first input sub-circuit 1441, the substrate and the source of the first switch tube 1442, the substrate and the source of the second switch tube 1443, and the substrate and the source of the third switch tube 1444.

The drain of the first switch tube 1442 is connected to the first input terminal of the latch and step-down circuit 1447, and the drain of the second switch tube 1443 is connected to the second input terminal of the latch and step-down circuit 1447. The first output terminal of the latch and step-down circuit 1447 is connected to the 1 selection terminal of the first switching module 1448 (e.g., an analog switch), and the second output terminal of the latch and step-down circuit 1447 is connected to the input terminal of the output sub-circuit 1449. The output terminal of the latch circuit 1446 is connected to the control terminal of the first switching module 1448, and the fixed terminal of the first switching module 1448 is connected to the positive terminal of the power supply of the output sub-circuit 1449. The VB2 is connected to the positive terminal of the power supply of the latch circuit 1446, the positive terminal of the power supply of the latch and step-down circuit 1447, and the 0 selection terminal of the first switching module 1448. The VS2 is connected to the negative terminal of the power supply of the latch circuit 1446, the negative terminal of the power supply of the latch and step-down circuit 1447, and the negative terminal of the power supply of the output sub-circuit 1449. The HO2 is connected to the output terminal of the output sub-circuit 1449.

The function of the first input sub-circuit 1441 is described as follows:

at the rising edge of the signal at the input terminal of the first input sub-circuit 1441, the first output terminal of the first input sub-circuit 1441 outputs a pulse signal with a pulse width of about 300 ns; at the falling edge of the signal at the input terminal of the first input sub-circuit 1441, the second output terminal of the first input sub-circuit 1441 outputs a pulse signal with a pulse width of about 300 ns. When the control input terminal 12 of the first input sub-circuit 1441 is connected with a high level, the third output terminal of the first input sub-circuit 1441 outputs a pulse signal with a pulse width of about 300 ns.

The function of the latch circuit 1446 is described as follows:

when a low level signal is present at the input terminal of the latch circuit 1446, the output terminal of the latch circuit 1446 outputs a high level, otherwise the output terminal of the latch circuit 1446 outputs a low level.

The function of the latch and step-down circuit 1447 is described as follows:

when a low level is present at the first input terminal of the latch and step-down circuit 1447, the second output terminal of the latch and step-down circuit 1447 continuously outputs a high level; and when a low level is present at the second input terminal of the latch and step-down circuit 1447, the first output terminal of the latch and step-down circuit 1447 continuously outputs a low level. That is, the signal from the HIN2 is decomposed into two pulse signals at two output terminals of the first input sub-circuit 1441 which are re-integrated into a complete signal. In addition, the latch and step-down circuit 1447 has a step-down circuit inside, and the second output terminal of the latch and step-down circuit 1447 outputs a voltage of 15V for VS2.

The function of the output sub-circuit 1449 is:

to output a signal having a voltage which is consistent with the positive terminal of the power supply thereof when being connected with a high level or is consistent with the negative terminal of the power supply thereof when being connected with a low level and having a phase position which is consistent with that of the HIN2.

Here, using a 300 ns narrow pulse signal to control the first switch tube 1442, the second switch tube 1443, and the third switch tube 1444 is to shorten the conduction time for the first switch tube 1442, the second switch tube 1443, and the third switch tube 1444, thereby reducing respective power consumption.

Its working principle is described as follows:

after the signal from HIN2 passes through the first input sub-circuit 1441, the first output terminal and the second output terminal of the first input sub-circuit 1441 output 300 ns narrow pulses at the rising edge and the falling edge of the signal, respectively. The narrow pulses are configured to respectively control the first switch tube 1442 and the second switch tube 1443 to be turned on for 300 ns, so that the first input terminal and the second input terminal of the latch and step-down circuit 1447 generate 300 ns low levels, respectively. The latch and step-down circuit 1447 has an RS trigger and other devices inside, so that two low level signals are recombined into a complete signal having a phase same as the HIN2.

When the control input terminal 12 is connected with a low level, a high level pulse is not present at the third output terminal of the first input sub-circuit 1441, the third switch tube 1444 is not turned on, and the low level is not present at the control input terminal 12 of the latch circuit 1446, then the output terminal of the latch circuit 1446 maintains at a low level. The positive terminal of the power supply of the output sub-circuit 1449 remains connected to the 0 selection terminal of the first switching module 1448, i.e., connected to the VB2, such that the output sub-circuit 1449 outputs the high/low level in the range of 0 V to 20 V to adapt to the SiC device in the switch tube for giving full play to its performance.

When the control input terminal 12 is connected with a high level, a high level pulse is present at the third output terminal of the first input sub-circuit 1441, the third switch tube 1444 is turned on for 300 ns, and a 300 ns low level is present at the control input terminal 12 of the latch circuit 1446, then the output terminal of the latch circuit 1446 outputs a high level. The positive terminal of the power supply of the output sub-circuit 1449 is switched to be connected to the 1 selection terminal of the first switching module 1448, i.e., connected to the first output terminal of the latch and step-down circuit 1447, such that the output sub-circuit 1449 outputs the high/low level in the range of 0 V to 15 V to adapt to the Si device in the switch tube for giving full play to its performance.

Its working principle is described as follows:

after the signal from the HIN2 passes through the first input sub-circuit 1441, the first output terminal and the second output terminal of the first input sub-circuit 1441 output 300 ns narrow pulses at the rising edge and the falling edge of the signal, respectively. The narrow pulses are configured to respectively control the first switch tube 1442 and the second switch tube 1443 to be turned on for 300 ns, so that the first input terminal and the second input terminal of the latch and step-down circuit 1447 generate 300 ns low levels, respectively. The latch and step-down circuit 1447 has an RS trigger and other devices inside, so that two low level signals are recombined into a complete signal having a phase same as the HIN2.

When the switch tube includes a SiC MOS tube and the control input terminal 12 is connected with a low level, a high level pulse is not present at the third output terminal of the first input sub-circuit 1441, the third switch tube 1444 is not turned on, and the low level is not present at the control input terminal 12 of the latch circuit 1446, then the output terminal of the latch circuit 1446 maintains at a low level. The positive terminal of the power supply of the output sub-circuit 1449 remains connected to the 0 selection terminal of the first switching module 1448, i.e., connected to the VB2, such that the output sub-circuit 1449 outputs the high/low level in the range of 0 V to 20 V.

When the switch tube does not include a SiC MOS tube and the control input terminal 12 is connected with a high level, a high level pulse is present at the third output terminal of the first input sub-circuit 1441, the third switch tube 1444 is turned on for 300 ns, and a 300 ns low level is present at the control input terminal 12 of the latch circuit 1446, then the output terminal of the latch circuit 1446 outputs a high level. The positive terminal of the power supply of the output sub-circuit 1449 is switched to be connected to the 1 selection terminal of the first switching module 1448, i.e., connected to the first output terminal of the latch and step-down circuit 1447, such that the output sub-circuit 1449 outputs the high/low level in the range of 0 V to 15 V.

With reference to FIGS. 1 and 10, the WH driving circuit 146 is same as the UH driving circuit 142, the WH driving circuit 146 includes: a first input sub-circuit 1461, a first switch tube 1462, a second switch tube 1463, a third switch tube 1464, and a first voltage output sub-circuit 1465. The first input sub-circuit 1461 is connected to the control input terminal 12. The first input sub-circuit 1461 includes a first output terminal, a second output terminal and a third output terminal, wherein when the control input terminal 12 is connected with a low level, the first output terminal and the second output terminal output trigger pulses; and when the control input terminal 12 is connected with a high level, the first output terminal, the second output terminal and the third output terminal output trigger pulses.

The first switch tube 1462 is connected to the first output terminal, when the first output terminal outputs a trigger pulse, the first switch tube 1462 is turned on. The second switch tube 1463 is connected to the second output terminal, when the second output terminal outputs a trigger pulse, the second switch tube 1463 is turned on. The third switch tube 1464 is connected to the third output terminal, when the third output terminal outputs a trigger pulse, the third switch tube 1464 is turned on.

The first voltage output sub-circuit 1465 is connected to the first switch tube 1462, a second switch tube 1463 and a third switch tube 1464, respectively. When the control input terminal 12 is connected with a low level, a high level is not present at the third output terminal of the first input sub-circuit 1461, the third switch tube 1464 is not turned on, at which time the first voltage output sub-circuit 1465 outputs the high/low level signal in the first voltage range. When the control input terminal 12 is connected with a high level, a high level pulse is present at the third output terminal of the first input sub-circuit 1461, the third switch tube 1464 is turned on for outputting the high/low level signal in the second voltage range.

Continue referring to FIG. 10, the first voltage output sub-circuit 1465 includes: a latch circuit 1466, a latch and step-down circuit 1467 and a first switching module 1468.

The latch and step-down circuit 1467 is connected to the first switch tube 1462 and the second switch tube 1463. The first switching module 1468 is connected to the latch and step-down circuit 1467 and the power supply, respectively. The latch circuit 1466 is connected to the third switch tube 1464. The latch circuit 1466 is configured to control the first switching module 1468: when the third switch tube 1464 is not turned on, the latch circuit 1466 is configured to control an action of the first switching module 1468 to take a voltage of the power supply as an output voltage of the output sub-circuit 1469; and when the third switch tube 1464 is turned on, the latch circuit 1466 is configured to control an action of the first switching module 1468 to take an output voltage of the latch and step-down circuit 1467 as an output voltage of the output sub-circuit 1469.

As shown in FIG. 10, inside the WH driving circuit 146, the VCC is connected to the positive terminal of the power supply of the first input sub-circuit 1461; the HIN3 is connected to the input terminal of the first input sub-circuit 1461; and the control input terminal 12 is connected to the control terminal of the first input sub-circuit 1461. The first output terminal of the first input sub-circuit 1461 is connected to the gate of the first switch tube (such as a high-voltage DMOS tube) 1462; the second output terminal of the first input sub-circuit 1461 is connected to the gate of the second switch tube (such as a high-voltage DMOS tube) 1463; and the third output terminal of the first input sub-circuit 1461 is connected to the gate of the third switch tube (such as a high-voltage DMOS tube) 1464. The GND terminal is connected to the negative terminal of the power supply of the first input sub-circuit 1461, the substrate and the source of the first switch tube 1462, the substrate and the source of the second switch tube 1463, and the substrate and the source of the third switch tube 1464.

The drain of the first switch tube 1462 is connected to the first input terminal of the latch and step-down circuit 1467, and the drain of the second switch tube 1463 is connected to the second input terminal of the latch and step-down circuit 1467. The first output terminal of the latch and step-down circuit 1467 is connected to the 1 selection terminal of the first switching module 1468 (e.g., an analog switch), and the second output terminal of the latch and step-down circuit 1467 is connected to the input terminal of the output sub-circuit 1469. The output terminal of the latch circuit 1466 is connected to the control terminal of the first switching module 1468, and the fixed terminal of the first switching module 1468 is connected to the positive terminal of the power supply of the output sub-circuit 1469. The VB3 is connected to the positive terminal of the power supply of the latch circuit 1466, the positive terminal of the power supply of the latch and step-down circuit 1467, and the 0 selection terminal of the first switching module 1468. VS3 is connected to the negative terminal of the power supply of the latch circuit 1466, the negative terminal of the power supply of the latch and step-down circuit 1467, and the negative terminal of the power supply of the output sub-circuit 1469. The HO3 is connected to the output terminal of the output sub-circuit 1469.

The function of the first input sub-circuit 1461 is described as follows:

at the rising edge of the signal at the input terminal of the first input sub-circuit 1461, the first output terminal of the first input sub-circuit 1461 outputs a pulse signal with a pulse width of about 300 ns; at the falling edge of the signal at the input terminal of the first input sub-circuit 1461, the second output terminal of the first input sub-circuit 1461 outputs a pulse signal with a pulse width of about 300 ns. When the control input terminal 12 of the first input sub-circuit 1461 is connected with a high level, the third output terminal of the first input sub-circuit 1461 outputs a pulse signal with a pulse width of about 300 ns.

The function of the latch circuit 1466 is described as follows:

when a low level signal is present at the input terminal of the latch circuit 1466, the output terminal of the latch circuit 1466 outputs a high level, otherwise the output terminal of the latch circuit 1466 outputs a low level.

The function of the latch and step-down circuit 1467 is described as follows:

when a low level is present at the first input terminal of the latch and step-down circuit 1467, the second output terminal of the latch and step-down circuit 1467 continuously outputs a high level; and when a low level is present at the second input terminal of the latch and step-down circuit 1467, the first output terminal of the latch and step-down circuit 1467 continuously outputs a low level. That is, the signal from the HIN3 is decomposed into two pulse signals at two output terminals of the first input sub-circuit 1461 which are re-integrated into a complete signal. In addition, the latch and step-down circuit 1467 has a step-down circuit inside, and the second output terminal of the latch and step-down circuit 1467 outputs a voltage of 15V for the VS3.

The function of the output sub-circuit 1469 is:

to output a signal having a voltage which is consistent with the positive terminal of the power supply thereof when being connected with a high level or is consistent with the negative terminal of the power supply thereof when being connected with a low level and having a phase position which is consistent with that of the HIN3.

Here, using a 300 ns narrow pulse signal to control the first switch tube 1462, the second switch tube 1463, and the third switch tube 1464 is to shorten the conduction time for the first switch tube 1462, the second switch tube 1463, and the third switch tube 1464, thereby reducing respective power consumption.

Its working principle is described as follows:

after the signal from the HIN3 passes through the first input sub-circuit 1461, the first output terminal and the second output terminal of the first input sub-circuit 1461 output 300 ns narrow pulses at the rising edge and the falling edge of the signal, respectively. The narrow pulses are configured to respectively control the first switch tube 1462 and the second switch tube 1463 to be turned on for 300 ns, so that the first input terminal and the second input terminal of the latch and step-down circuit 1467 generate 300 ns low levels, respectively. The latch and step-down circuit 1467 has an RS trigger and other devices inside, so that two low level signals are recombined into a complete signal having a phase same as the HIN3.

When the control input terminal 12 is connected with a low level, a high level pulse is not present at the third output terminal of the first input sub-circuit 1461, the third switch tube 1464 is not turned on, and the low level is not present at the control input terminal 12 of the latch circuit 1466, then the output terminal of the latch circuit 1466 maintains at a low level. The positive terminal of the power supply of the output sub-circuit 1469 remains connected to the 0 selection terminal of the first switching module 1468, i.e., connected to the VB3, such that the output sub-circuit 1469 outputs the high/low level in the range of 0 V to 20 V to adapt to the SiC device in the switch tube for giving full play to its performance.

When the control input terminal 12 is connected with a high level, a high level pulse is present at the third output terminal of the first input sub-circuit 1461, the third switch tube 1464 is turned on for 300 ns, and a 300 ns low level is present at the control input terminal 12 of the latch circuit 1466, then the output terminal of the latch circuit 1466 outputs a high level. The positive terminal of the power supply of the output sub-circuit 1469 is switched to be connected to the 1 selection terminal of the first switching module 1468, i.e., connected to the first output terminal of the latch and step-down circuit 1467, such that the output sub-circuit 1469 outputs the high/low level in the range of 0 V to 15 V to adapt to the Si device in the switch tube for giving full play to its performance.

Its working principle is described as follows:

after the signal from the HIN3 passes through the first input sub-circuit 1461, the first output terminal and the second output terminal of the first input sub-circuit 1461 output 300 ns narrow pulses at the rising edge and the falling edge of the signal, respectively. The narrow pulses are configured to respectively control the first switch tube 1462 and the second switch tube 1463 to be turned on for 300 ns, so that the first input terminal and the second input terminal of the latch and step-down circuit 1467 generate 300 ns low levels, respectively. The latch and step-down circuit 1467 has an RS trigger and other devices inside, so that two low level signals are recombined into a complete signal having a phase same as the HIN3.

When the switch tube includes a SiC MOS tube and the control input terminal 12 is connected with a low level, a high level pulse is not present at the third output terminal of the first input sub-circuit 1461, the third switch tube 1464 is not turned on, and the low level is not present at the control input terminal 12 of the latch circuit 1466, then the output terminal of the latch circuit 1466 maintains at a low level. The positive terminal of the power supply of the output sub-circuit 1469 remains connected to the 0 selection terminal of the first switching module 1468, i.e., connected to the VB3, such that the output sub-circuit 1469 outputs the high/low level in the range of 0 V to 20 V.

When the switch tube does not include a SiC MOS tube and the control input terminal 12 is connected with a high level, a high level pulse is present at the third output terminal of the first input sub-circuit 1461, the third switch tube 1464 is turned on for 300 ns, and a 300 ns low level is present at the control input terminal 12 of the latch circuit 1466, then the output terminal of the latch circuit 1466 outputs a high level. The positive terminal of the power supply of the output sub-circuit 1469 is switched to be connected to the 1 selection terminal of the first switching module 1468, i.e., connected to the first output terminal of the latch and step-down circuit 1467, such that the output sub-circuit 1469 outputs the high/low level in the range of 0 V to 15 V.

The structure of the UL/VL/WL driving circuit 162 is described below in conjunction with FIG. 11.

With reference to FIG. 11, the UL/VL/WL driving circuit 162 includes: a second input sub-circuit 1621, a step-down sub-circuit 1622, and a second voltage output sub-circuit 1623. The second input sub-circuit 1621 includes a first output terminal, a second output terminal, a third output terminal and a fourth output terminal, wherein when the control input terminal 12 is connected with a low level, the second output terminal, the third output terminal and the fourth output terminal output trigger pulses; and when the control input terminal 12 is connected with a high level, the first output terminal, the second output terminal, the third output terminal and the fourth output terminal output trigger pulses. The step-down sub-circuit 1622 is configured to step-down a voltage of the power voltage to the second voltage range, that is, the output terminal of the step-down sub-circuit 1622 outputs a voltage of 15 V for the GND terminal. The second voltage output sub-circuit 1623 is connected to the second input sub-circuit 1621 and the step-down sub-circuit 1622, wherein when the second output terminal, the third output terminal and the fourth output terminal output trigger pulses, the second voltage output sub-circuit 1623 outputs the high/low level signal in the first voltage range; and when the first output terminal, the second output terminal, the third output terminal and the fourth output terminal output trigger pulses, the second voltage output sub-circuit 1623 outputs the high/low level signal in the second voltage range.

Continue referring to FIG. 11, the second voltage output sub-circuit 1623 includes: a UL output circuit 1624, a VL output circuit 1625 and a WL output circuit 1626 which are connected to the second output terminal, the third output terminal and fourth output terminal of the second input sub-circuit 1621, respectively; and a second switching module 1627, a third switching module 1628 and a fourth switching module 1629 which are connected to the UL output circuit 1624, the VL output circuit 1625 and the WL output circuit 1626, respectively. The second switching module 1627, the third switching module 1628 and the fourth switching module 1629 are configured to select a voltage of the power supply or an output voltage of the step-down sub-circuit 1622 as an output voltage of the second voltage output sub-circuit according to the first output terminal of the second input sub-circuit 1621.

As shown in FIG. 11, inside the UL/VL/WL driving circuit 162, the VCC is connected to a positive terminal of the power supply of the second input sub-circuit 1621, a positive terminal of the power supply of the step-down sub-circuit 1622, the 0 selection terminal of the second switching module (e.g., an analog switch) 1627, the 0 selection terminal of the third switching module (e.g., an analog switch) 1628, and the 0 selection terminal of the fourth switching module (e.g., an analog switch) 1629.

The LIN1 is connected to the first input terminal of the second input sub-circuit 1621. The LIN2 is connected to the second input terminal of the second input sub-circuit 1621. The LIN3 is connected to the third input terminal of the second input sub-circuit 1621. The control input terminal 12 is connected to the control terminal of the second input sub-circuit 1621.

The second output terminal of the second input sub-circuit 1621 is connected to the input terminal of the UL output circuit 1624. The third output terminal of the second input sub-circuit 1621 is connected to the input terminal of the VL output circuit 1625. The fourth output terminal of the second input sub-circuit 1621 is connected to the input terminal of the WL output circuit 1626. The first output terminal of the second input sub-circuit 1621 is connected to the control terminal of the second switching module 1627, the control terminal of the third switching module 1628 and the control terminal of the fourth switching module 1629, respectively.

The GND terminal is connected to a negative terminal of the power supply of the second input sub-circuit 1621, a negative terminal of the power supply of the step-down sub-circuit 1622, a negative terminal of the power supply of the UL output circuit 1624, a negative terminal of the power supply of the VL output circuit 1625, and a negative terminal of the power supply of the WL output circuit 1626. The output terminal of the step-down sub-circuit 1622 is connected to the 1 selection terminal of the second switching module 1627, the 1 selection terminal of the third switching module 1628, and the 1 selection terminal of the fourth switching module 1629, respectively. The LO1 is connected to the output terminal of the UL output circuit 1624. The LO2 is connected to the output terminal of the VL output circuit 1625. The LO3 is connected to the output terminal of the WL output circuit 1626.

The function of the second input sub-circuit 1621 is described as follows:

the second output terminal of the second input sub-circuit 1621 outputs a signal same as that at the first input terminal of the second input sub-circuit 1621; the third output terminal of the second input sub-circuit 1621 outputs a signal same as that at the second input terminal of the second input sub-circuit 1621; and the fourth output terminal of the second input sub-circuit 1621 outputs a signal same as that at the third input terminal of the second input sub-circuit 1621. When the input terminal of the second input sub-circuit 1621 is connected with a high level, the first output terminal of the second input sub-circuit 1621 outputs the high level. When the input terminal of the second input sub-circuit 1621 is connected with a low level, the first output terminal of the second input sub-circuit 1621 outputs the low level.

The function of the step-down sub-circuit 1622 is that the output terminal of the step-down sub-circuit 1622 outputs a voltage of 15 V for the GND terminal.

The function of the UL output circuit 1624 is: to output a signal having a voltage which is consistent with the positive terminal of the power supply thereof when being connected with a high level or is consistent with the negative terminal of the power supply thereof when being connected with a low level and having a phase position which is consistent with that of the LIN1.

The function of the VL output circuit 1625 is: to output a signal having a voltage which is consistent with the positive terminal of the power supply thereof when being connected with a high level or is consistent with the negative terminal of the power supply thereof when being connected with a low level and having a phase position which is consistent with that of the LIN2.

The function of the WL output circuit 1626 is: to output a signal having a voltage which is consistent with the positive terminal of the power supply thereof when being connected with a high level or is consistent with the negative terminal of the power supply thereof when being connected with a low level and having a phase position which is consistent with that of the LIN3.

Its working principle is described as follows:

After the signals from the LIN1, LIN2 and LIN3 pass through the second input sub-circuit 1621, the second output terminal, the third output terminal and the fourth output terminal of the second input sub-circuit 1621 output signals having a phase position same as that of the LIN1, LIN2 and LIN3 and a shaped square wave, respectively.

When the switch tube includes a SiC MOS tube and the control input terminal 12 is connected with a low level, the first output terminal of the second input sub-circuit 1621 outputs the low level, the fixed terminal of the second switching module 1627 is connected to the 0 selection terminal of the second switching module 1627; the fixed terminal of the third switching module 1628 is connected to the 0 selection terminal of the third switching module 1628; and the fixed terminal of the fourth switching module 1629 is connected to the 0 selection terminal of the fourth switching module 1629, so that the LO1 outputs a signal of 0 V to 20 V having a phase same as that at the input terminal of the UL output circuit 1624; the LO2 outputs a signal of 0 V to 20 V having a phase same as that at the input terminal of the VL output circuit 1625; and the LO3 outputs a signal of 0 V to 20 V having a phase same as that at the input terminal of the WL output circuit 1626.

When the switch tube does not include a SiC MOS tube and the control input terminal 12 is connected with a high level, the first output terminal of the second input sub-circuit 1621 outputs the high level, the fixed terminal of the second switching module 1627 is connected to the 1 selection terminal of the second switching module 1627; the fixed terminal of the third switching module 1628 is connected to the 1 selection terminal of the third switching module 1628; and the fixed terminal of the fourth switching module 1629 is connected to the 1 selection terminal of the fourth switching module 1629, so that the LO1 outputs a signal of 0 V to 15 V having a phase same as that at the input terminal of the UL output circuit 1624; the LO2 outputs a signal of 0 V to 15 V having a phase same as that at the input terminal of the VL output circuit 1625; and the LO3 outputs a signal of 0 V to 15 V having a phase same as that at the input terminal of the WL output circuit 1626.

The technical solutions according to the above embodiments of the present disclosure at least have the following technical effects or advantages.

The voltage of the power supply for the power device 100 according to certain embodiments of the present disclosure remains unchanged at 20 V, the peripheral circuit does not need to be modified, and the power consumption of the high voltage integrated circuit has not substantially increased. The same high voltage integrated circuit is configured to drive both the SiC device and the Si device, such that the risk where materials are mixed is avoided in the production process, thus facilitating material organization and reduction of material costs. The voltage used to drive the SiC device is 20 V and the voltage used to drive the Si device is 15 V, such that the respective conduction processes of the SiC device and the Si device both are in the full conduction state with individual performances achieved.

Figure 12:
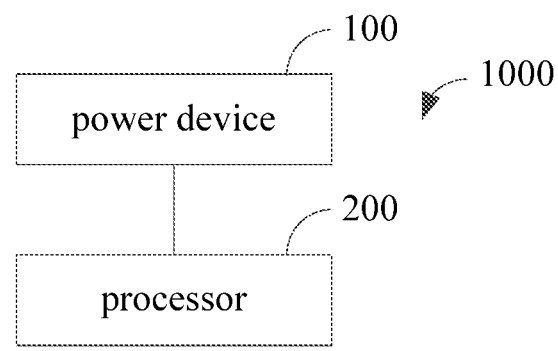
FIG. 12 is a block diagram showing an electric appliance according to an embodiment of the present disclosure.

With reference to FIG. 12, the present disclosure further provides in embodiments an electric appliance 1000, including a power device 100 described above and a processor 200, the processor 200 is connected to the power device 100. The electric appliance may be an air conditioner (including a household air conditioner, and a commercial air conditioner), a washing machine, a refrigerator, an induction cooker, etc., and the power device 100 can achieve the functions described in the foregoing description.

The voltage of the power supply for the power device 100 in the electric appliance 1000 according to certain embodiments of the present disclosure remains unchanged at 20 V, the peripheral circuit does not need to be modified, and the power consumption of the HVIC tube has not substantially increased. The same HVIC tube is configured to drive both the SiC device and the Si device, such that the risk where materials are mixed is avoided in the production process, thus facilitating material organization and reduction of material costs. The voltage used to drive the SiC device is 20 V and the voltage used to drive the Si device is 15 V, such that the respective conduction processes of the SiC device and the Si device both are in the full conduction state with individual performances achieved.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on", "above" or "on top of" a second feature may include an embodiment in which the first feature is right or obliquely "on", "above" or "on top of" the second feature, or just means that the first feature is at a height higher than that of the second feature; while a first feature "below", "under" or "on bottom of" a second feature may include an embodiment in which the first feature is right or obliquely "below", "under" or "on bottom of" the second feature, or just means that the first feature is at a height lower than that of the second feature.

The disclosure herein provides many different embodiments or examples for realizing different structures of the present disclosure. In order to simplify the present disclosure, the components and settings of specific examples are described herein. Of course, they are only examples, and are not intended to limit the present disclosure. In addition, reference numerals and/or reference letters may be repeated in different examples in the present disclosure. Such repetition is for the purpose of simplification and clarity, and does not indicate the relationship between the various embodiments and/or settings under discussion. In addition, the present disclosure provides examples of various specific processes and materials, but those of ordinary skill in the art may be aware of application of other processes and/or use of other materials.

In the description of this specification, the description with reference to the term such as "an embodiment", "some embodiments", "illustrative embodiments", "an example", "a specific example" or "some examples", and the like refer to incorporation of the specific features, structures, materials or characteristics described in the embodiments or examples is included in at least one embodiment or example of the present disclosure. In this specification, the illustrative expression of the above-mentioned term does not necessarily refer to the same embodiment or example. Moreover, the described specific features, structures, materials or characteristics can be combined in an appropriate manner in any one or more embodiments or examples.

Although the embodiments of the present disclosure have been shown and described, those of ordinary skill in the art can understand that various changes, modifications, substitutions, and alternative can be made to these embodiments without departing from the principle and purpose of the present disclosure. The scope of the present disclosure is defined by the claims and their equivalents.

What is claimed is:

1. A power device comprising:
   a control input terminal,
   an upper bridge arm switch tube and a lower bridge arm switch tube,
   a first driving circuit, connected to the control input terminal and configured to drive the upper bridge arm switch tube; and
   a second driving circuit, connected to the control input terminal and configured to drive the lower bridge arm switch tube,
   wherein:
   the control input terminal is connectable with a low level or a high level,
   when the control input terminal is connected with the low level, the first driving circuit and the second driving circuit output a high/low level signal in a first voltage range,
   when the control input terminal is connected with the high level, the first driving circuit and the second driving circuit output a high/low level signal in a second voltage range, and
   the first voltage range is different from the second voltage range, and
   wherein:
   the first driving circuit comprises a UH (U-phase High-side) driving circuit, a VH (V-phase High-side) driving circuit and a WH (W-phase High-side) driving circuit,
   the upper bridge arm switch tube comprises a first upper bridge arm switch tube, a second upper bridge arm switch tube and a third upper bridge arm switch tube,
   the control input terminal is connected to each of the UH driving circuit, the VH driving circuit and the WH driving circuit, and
   the UH driving circuit is connected to the first upper bridge arm switch tube and configured to drive the first upper bridge arm switch tube, the VH driving circuit is connected to the second upper bridge arm switch tube and configured to drive the second upper bridge arm switch tube, and the WH driving circuit is connected to the third upper bridge arm switch tube and configured to drive the third upper bridge arm switch tube.

2. The power device according to claim 1, further comprising a GND terminal and a VCC terminal, when the control input terminal is connected to the GND terminal through a bonding wire, the control input terminal is connected with the low level, and when the control input terminal is connected to the VCC terminal through a bonding wire, the control input terminal is connected with the high level.

3. The power device according to claim 1, further comprising a controller, connected to the control input terminal and configured to output the low level or the high level.

4. The power device according to claim 1, wherein the first voltage range is 0 V to 20 V, and the second voltage range is 0 V to 15 V.

5. The power device according to claim 1, wherein
the second driving circuit comprises a UL/VL/WL (U-phase Low-side/V-phase Low-side/W-phase Low-side) driving circuit;
the lower bridge arm switch tube comprises a first lower bridge arm switch tube, a second lower bridge arm switch tube and a third lower bridge arm switch tub; and
the control input terminal is connected to the UL/VL/WL driving circuit, the UL/VL/WL driving circuit is configured to drive the first lower bridge arm switch tube, the second lower bridge arm switch tube and the third lower bridge arm switch tube, and the UL/VL/WL driving circuit is connected to the first lower bridge arm switch tube, the second lower bridge arm switch tube and the third lower bridge arm switch tube.

6. The power device according to claim 5, wherein:
when the first upper bridge arm switch tube, the second upper bridge arm switch tube, the third upper bridge arm switch tube, the first lower bridge arm switch tube, the second lower bridge arm switch tube and the third lower bridge arm switch tube each are a SiC device, the control input terminal is connected with the low level;
when the first upper bridge arm switch tube, the second upper bridge arm switch tube, the third upper bridge arm switch tube, the first lower bridge arm switch tube, the second lower bridge arm switch tube and the third lower bridge arm switch tube each are a Si device, the control input terminal is connected with the high level.

7. The power device according to claim 6, wherein the UH driving circuit, the VH driving circuit, or the WH driving circuit comprises:
a first input sub-circuit, connected to the control input terminal and comprising a first output terminal, a second output terminal and a third output terminal, wherein:
when the control input terminal is connected with the low level, the first output terminal and the second output terminal output trigger pulses; and
when the control input terminal is connected with the high level, the first output terminal, the second output terminal and the third output terminal output trigger pulses;
a first switch tube, a second switch tube and a third switch tube,
wherein:
the first switch tube is connected to the first output terminal, when the first output terminal outputs a trigger pulse, the first switch tube is turned on,
the second switch tube is connected to the second output terminal, when the second output terminal outputs a trigger pulse, the second switch tube is turned on, and
the third switch tube is connected to the third output terminal, when the third output terminal outputs a trigger pulse, the third switch tube is turned on; and
a first voltage output sub-circuit, connected to the first switch tube, the second switch tube and the third switch tube, respectively,
wherein:
the first voltage output sub-circuit outputs the high/low level signal in the first voltage range when the first switch tube and the second switch tube are turned on and the third switch tube is not turned on, and
the first voltage output sub-circuit outputs the high/low level signal in the second voltage range when the first switch tube, the second switch tube and the third switch tube are turned on.

8. The power device according to claim 7, wherein the first voltage output sub-circuit comprises:
a latch and step-down circuit, connected to the first switch tube and the second switch tube,
a first switching module, connected to the latch and step-down circuit and a power supply respectively,
a latch circuit, connected to the third switch tube,
wherein:
when the third switch tube is not turned on, the latch circuit is configured to control an action of the first switching module to take a voltage of the power supply as an output voltage of the output sub-circuit; and
when the third switch tube is turned on, the latch circuit is configured to control an action of the first switching module to take an output voltage of the latch and step-down circuit as an output voltage of the output sub-circuit.

9. The power device according to claim 6, wherein the UL/VL/WL driving circuit comprises:
a second input sub-circuit, comprising a first output terminal,
wherein:
when the control input terminal is connected with the low level, the first output terminal of the second input sub-circuit outputs a low level, and
when the control input terminal is connected with the high level, the first output terminal of the second input sub-circuit outputs a high level;
a step-down sub-circuit, configured to step-down a voltage of a power supply to the second voltage range; and
a second voltage output sub-circuit, connected to the second input sub-circuit and the step-down sub-circuit, wherein:
when the first output terminal of the second input sub-circuit outputs the low level, the second voltage output sub-circuit outputs the high/low level signal in the first voltage range, and
when the first output terminal of the second input sub-circuit outputs the high level, the second voltage output sub-circuit outputs the high/low level signal in the second voltage range.

10. The power device according to claim 9, wherein the second input sub-circuit comprises a second output terminal, a third output terminal and a fourth output terminal, wherein the second voltage output sub-circuit comprises:
a UL output module, a VL output module and a WL output module, respectively connected to the second output terminal, the third output terminal and fourth output terminal of the second input sub-circuit, and
a second switching module, a third switching module and a fourth switching module, respectively connected to the UL output module, the VL output module and the WL output module,
wherein the second switching module, the third switching module and the fourth switching module are configured to select the voltage of the power supply or an output voltage of the step-down sub-circuit as an output voltage of the second voltage output sub-circuit according to the first output terminal of the second input sub-circuit.

11. An electric appliance, comprising a power device and a processor connected to the power device,
wherein the power device comprises:
a control input terminal;
an upper bridge arm switch tube and a lower bridge arm switch tube;
a first driving circuit, connected to the control input terminal and configured to drive the upper bridge arm switch tube; and
a second driving circuit, connected to the control input terminal and configured to drive the lower bridge arm switch tube;
wherein:
the control input terminal is connectable with a high level or a low level,
when the control input terminal is connected with the low level, the first driving circuit and the second driving circuit output a high/low level signal in a first voltage range,
when the control input terminal is connected with the high level, the first driving circuit and the second driving circuit output a high/low level signal in a second voltage range, and
the first voltage range is different from the second voltage range, and
wherein:
the first driving circuit comprises a UH (U-phase High-side) driving circuit, a VH (V-phase High-side) driving circuit and a WH (W-phase High-side) driving circuit,
the upper bridge arm switch tube comprises a first upper bridge arm switch tube, a second upper bridge arm switch tube and a third upper bridge arm switch tube,
the control input terminal is connected to each of the UH driving circuit, the VH driving circuit and the WH driving circuit, and
the UH driving circuit is connected to the first upper bridge arm switch tube and configured to drive the first upper bridge arm switch tube, the VH driving circuit is connected to the second upper bridge arm switch tube and configured to drive the second upper bridge arm switch tube, and the WH driving circuit is connected to the third upper bridge arm switch tube and configured to drive the third upper bridge arm switch tube.

12. The electric appliance according to claim 11, wherein the power device further comprises: a GND terminal and a VCC terminal,
wherein:
when the control input terminal is connected to the GND terminal through a bonding wire, the control input terminal is connected with the low level, and
when the control input terminal is connected to the VCC terminal through a bonding wire, the control input terminal is connected with the high level.

13. The electric appliance according to claim 11, wherein the power device comprises a controller,
wherein:
the control input terminal is connected to the controller, and
the controller is configured to output the low level or the high level.

14. The electric appliance according to claim 11, wherein the first voltage range is 0 V to 20 V, and the second voltage range is 0 V to 15 V.

15. The electric appliance according to claim 11, wherein:
the second driving circuit comprises a UL/VL/WL (U-phase Low-side/V-phase Low-side/W-phase Low-side) driving circuit; and
the lower bridge arm switch tube comprises a first lower bridge arm switch tube, a second lower bridge arm switch tube and a third lower bridge arm switch tube,
wherein:
the control input terminal is connected to the UL/VL/WL driving circuit, the UL/VL/WL driving circuit is configured to drive the first lower bridge arm switch tube, the second lower bridge arm switch tube and the third lower bridge arm switch tube, and the UL/VL/WL driving circuit is connected to the first lower bridge arm switch tube, the second lower bridge arm switch tube and the third lower bridge arm switch tube.

16. The electric appliance according to claim 15, wherein:
when the first upper bridge arm switch tube, the second upper bridge arm switch tube, the third upper bridge arm switch tube, the first lower bridge arm switch tube, the second lower bridge arm switch tube and the third lower bridge arm switch tube each are a SiC device, the control input terminal is connected with the low level; and
when the first upper bridge arm switch tube, the second upper bridge arm switch tube, the third upper bridge arm switch tube, the first lower bridge arm switch tube, the second lower bridge arm switch tube and the third lower bridge arm switch tube each are a Si device, the control input terminal is connected with the high level.

17. The electric appliance according to claim 16, wherein the UH driving circuit, the VH driving circuit, or the WH driving circuit comprises:
a first input sub-circuit, connected to the control input terminal and comprising a first output terminal, a second output terminal and a third output terminal,
wherein:
when the control input terminal is connected with the low level, the first output terminal and the second output terminal output trigger pulses; and
when the control input terminal is connected with the high level, the first output terminal, the second output terminal and the third output terminal output trigger pulses;
a first switch tube, a second switch tube and a third switch tube,
wherein:
the first switch tube is connected to the first output terminal, when the first output terminal outputs a trigger pulse, the first switch tube is turned on,
the second switch tube is connected to the second output terminal, when the second output terminal outputs a trigger pulse, the second switch tube is turned on, and
the third switch tube is connected to the third output terminal, when the third output terminal outputs a trigger pulse, the third switch tube is turned on; and
a first voltage output sub-circuit, connected to the first switch tube, the second switch tube and the third switch tube, respectively,
wherein:
the first voltage output sub-circuit outputs the high/low level signal in the first voltage range when the first switch tube and the second switch tube are turned on and the third switch tube is not turned on, and
the first voltage output sub-circuit outputs the high/low level signal in the second voltage range when the first switch tube, the second switch tube and the third switch tube are turned on.

18. The electric appliance according to claim 17, wherein the first voltage output sub-circuit comprises:
   a latch and step-down circuit, connected to the first switch tube and the second switch tube,
   a first switching module, connected to the latch and step-down circuit and a power supply respectively, and
   a latch circuit, connected to the third switch tube,
   wherein:
   when the third switch tube is not turned on, the latch circuit is configured to control an action of the first switching module to take a voltage of the power supply as an output voltage of the output sub-circuit; and
   when the third switch tube is turned on, the latch circuit is configured to control an action of the first switching module to take an output voltage of the latch and step-down circuit as an output voltage of the output sub-circuit.

19. The electric appliance according to claim 16, wherein the UL/VL/WL driving circuit comprises:
   a second input sub-circuit, comprising a first output terminal,
   wherein:
   when the control input terminal is connected with the low level, the first output terminal of the second input sub-circuit outputs a low level, and
   when the control input terminal is connected with the high level, the first output terminal of the second input sub-circuit outputs a high level;
   a step-down sub-circuit, configured to step-down a voltage of the power supply to the second voltage range; and
   a second voltage output sub-circuit, connected to the second input sub-circuit and the step-down sub-circuit,
   wherein:
   when the first output terminal of the second input sub-circuit outputs the low level, the second voltage output sub-circuit outputs the high/low level signal in the first voltage range, and
   when the first output terminal of the second input sub-circuit outputs the high level, the second voltage output sub-circuit outputs the high/low level signal in the second voltage range.

20. The electric appliance according to claim 19, wherein the second input sub-circuit comprises a second output terminal, a third output terminal and a fourth output terminal, wherein the second voltage output sub-circuit comprises:
   a UL output module, a VL output module and a WL output module, respectively connected to the second output terminal, the third output terminal and fourth output terminal of the second input sub-circuit,
   a second switching module, a third switching module and a fourth switching module, respectively connected to the UL output module, the VL output module and the WL output module,
   wherein the second switching module, the third switching module and the fourth switching module are configured to select the voltage of the power supply or an output voltage of the step-down sub-circuit as an output voltage of the second voltage output sub-circuit according to the first output terminal of the second input sub-circuit, the processor is connected to the power device.

21. A power device comprising:
   a control input terminal,
   an upper bridge arm switch tube and a lower bridge arm switch tube,
   a first driving circuit, connected to the control input terminal and configured to drive the upper bridge arm switch tube; and
   a second driving circuit, connected to the control input terminal and configured to drive the lower bridge arm switch tube,
   wherein:
   the control input terminal is connectable with a low level or a high level,
   when the control input terminal is connected with the low level, the first driving circuit and the second driving circuit output a high/low level signal in a first voltage range,
   when the control input terminal is connected with the high level, the first driving circuit and the second driving circuit output a high/low level signal in a second voltage range, and
   the first voltage range is different from the second voltage range, and
   wherein:
   the second driving circuit comprises a UL/VL/WL (U-phase Low-side/V-phase Low-side/W-phase Low-side) driving circuit;
   the lower bridge arm switch tube comprises a first lower bridge arm switch tube, a second lower bridge arm switch tube and a third lower bridge arm switch tub; and
   the control input terminal is connected to the UL/VL/WL driving circuit, the UL/VL/WL driving circuit is configured to drive the first lower bridge arm switch tube, the second lower bridge arm switch tube and the third lower bridge arm switch tube, and the UL/VL/WL driving circuit is connected to the first lower bridge arm switch tube, the second lower bridge arm switch tube and the third lower bridge arm switch tube.

* * * * *